(12) United States Patent
Tu (10) Patent No.: US 8,190,033 B2
(45) Date of Patent: May 29, 2012

(54) WAVELENGTH DRIFT DETECTING APPARATUS, WAVELENGTH LOCKING SYSTEM AND METHOD

(75) Inventor: Minhai Tu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 527 days.

(21) Appl. No.: 12/424,039

(22) Filed: Apr. 15, 2009

(65) Prior Publication Data

US 2009/0232493 A1  Sep. 17, 2009

Related U.S. Application Data

(63) Continuation of application No. PCT/CN2007/071075, filed on Nov. 16, 2007.

(30) Foreign Application Priority Data

Feb. 13, 2007  (CN) .......................... 2007 1 0079261

(51) Int. Cl.
*H04B 10/08* (2006.01)
(52) U.S. Cl. ........................ 398/196; 398/197; 398/198
(58) Field of Classification Search .................. 398/182, 398/192, 195–198
See application file for complete search history.

(56) References Cited

U.S. PATENT DOCUMENTS

| 5,589,970 | A * | 12/1996 | Lyu et al. ......................... 398/95 |
| 6,233,261 | B1 * | 5/2001 | Mesh et al. .............. 372/29.012 |
| 6,501,773 | B1 * | 12/2002 | Volz et al. ................. 372/29.02 |
| 6,735,395 | B1 * | 5/2004 | Bai ................................ 398/95 |
| 2002/0048063 | A1 * | 4/2002 | Jung et al. ..................... 359/124 |
| 2003/0011841 | A1 * | 1/2003 | Lee ............................... 359/124 |
| 2003/0112836 | A1 * | 6/2003 | Kim et al. ....................... 372/18 |
| 2003/0123789 | A1 * | 7/2003 | Miyata et al. ................... 385/24 |
| 2004/0114852 | A1 * | 6/2004 | Brown ............................. 385/14 |
| 2006/0002438 | A1 * | 1/2006 | Brown ............................. 372/32 |
| 2006/0045520 | A1 * | 3/2006 | Nakano et al. .................. 398/33 |

(Continued)

FOREIGN PATENT DOCUMENTS

WO   WO 01/93383 A2   12/2001

OTHER PUBLICATIONS

First Chinese Office Action dated (mailed) Jul. 8, 2010, issued in related Application No. 200710079261.7, filed Feb. 13, 2007, Huawei Technologies Co., Ltd.

(Continued)

*Primary Examiner* — Nathan Curs
*Assistant Examiner* — Tanya Ngo
(74) *Attorney, Agent, or Firm* — Finnegan, Henderson, Farabow, Garrett & Dunner LLP (57) ABSTRACT

An apparatus for detecting wavelength drift and a system and method for locking wavelengths are disclosed herein so that multiple optical modules can share a wavelength locking apparatus without any wavelength selecting module. The output signals of only one optical module are scrambled at a time, and the identifier information carried in the optical signals output by different optical modules is the same, for example, the same frequency is applied to scrambling of every optical signal. Therefore, the scrambling apparatus is simplified, and the interference between scrambling signals is eliminated. Because no mechanical or electrical apparatus is used for controlling the wavelength switching, the cost is reduced, the locking speed is increased, the accuracy of signal processing is improved, and the precision of wavelength locking is enhanced.

9 Claims, 5 Drawing Sheets

U.S. PATENT DOCUMENTS

2006/0193633 A1* 8/2006 Minato et al. .................. 398/77
2007/0195831 A1* 8/2007 Tanaka .......................... 370/537

OTHER PUBLICATIONS

EP Communication—Supplementary European Search Report dated Apr. 23, 2010, issued in related European application No. 07817265.7, Huawei Technologies Co., Ltd.

EP Communication pursuant to Article 94(3) EPC, Examination Report dated Aug. 19, 2010, issued in related European application No. 07817265.7, Huawei Technologies Co., Ltd.

Written Opinion of the International Searching Authority (translation) dated (mailed) Jan. 3, 2008, issued in related application No. PCT/CN2007/071075, filed Nov. 16, 2007, Huawei Technologies Co., Ltd.

International Search Report from P.R. China in International Application No. PCT/CN2007/071075 mailed Jan. 3, 2008.

Second Chinese Office Action dated (mailed) Jan. 6, 2011, issued in related Chinese Application No. 200710079261.7 Huawei Technologies Co., Ltd.

* cited by examiner

WAVELENGTH DRIFT DETECTING APPARATUS, WAVELENGTH LOCKING SYSTEM AND METHOD

This application is a continuation of international application number PCT/CN2007/071075, filed Nov. 16, 2007, which claims a priority from the Chinese Patent Application No. 200710079261.7, filed with the Chinese Patent Office on Feb. 13, 2007 and entitled "Wavelength Drift Detecting Apparatus, Wavelength Locking System and Method", the contents of both of which are incorporated herein by reference in their entirety.

TECHNICAL FIELD

The present invention relates to optical communication technologies, and in particular, to an apparatus for detecting wavelength drift and a system and method for locking wavelengths in a Dense Wavelength Division Multiplexing (DWDM) system.

BACKGROUND

With rapid development of broadband services, stricter requirements are imposed on the transmission bandwidth. DWDM is a technology for increasing bandwidth on the existing optical network. This technology transmits multiple channels of signals of different wavelengths in one fiber based on DWDM, thus enhancing the transmission capability of a single fiber. When the number of fibers is limited, a Wavelength Division Multiplexing (WDM) system is one of the methods for increasing the transmission capacity efficiently.

In a DWDM system, with the increase of the transmission channels, the gap between channels is decreasing. Therefore, the control of the central frequency deviation is essential. In order to let the spectral energy of all channel signals fall within the passband of the corresponding optical demultiplexer, the central frequency deviation needs to be controlled within a certain range within the life span of the optical source while the optical source undergoes the ambient temperature and humidity (or temperature dependence) fluctuations. For the optical modules which are typically in optical networks having utilizing a 100 GHz or above channel spacing, the central frequency deviation may be controlled through constant temperature and power control. For the optical modules used in optical networks utilizing a 50 GHz or below channel spacing optical network, stricter requirements are imposed on the wavelength stability and precision control. Accordingly, the central frequency deviation may be controlled through wavelength locking. The wavelength locking mode in the prior art is outlined below.

Figure 1:
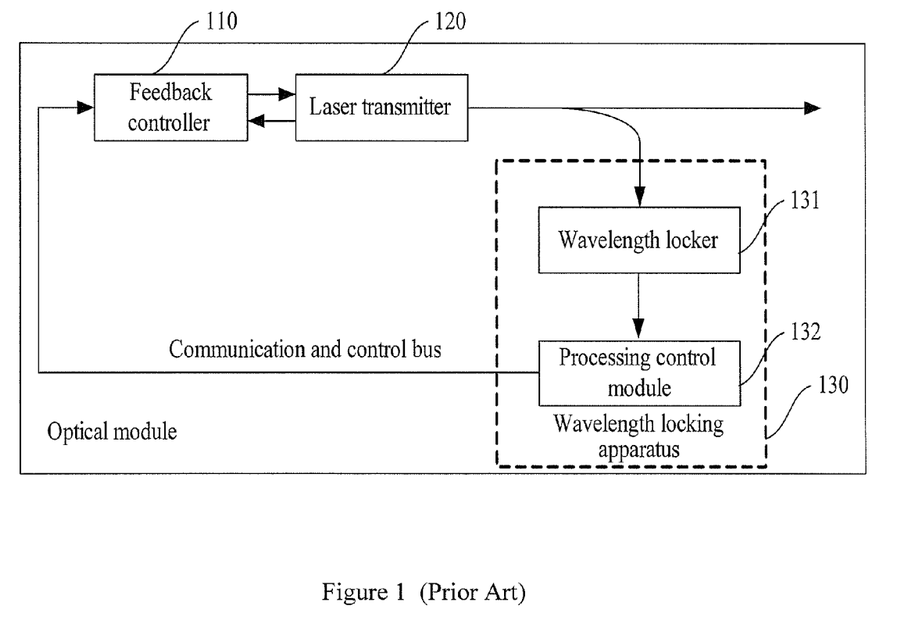
FIG. 1 shows a structure of the first implementation mode in the prior art.

FIG. 1 shows a structure of the first implementation mode in the prior art. An optical module includes: a feedback controller 110, a laser transmitter 120, and a wavelength locking apparatus 130.

In the optical signal emitted by the laser transmitter 120, a small portion of light enters the wavelength locking apparatus 130. The wavelength locking apparatus 130 includes a wavelength locker 131 and a processing control module 132. The wavelength locker 131 receives input optical signals, and outputs two channels of signals to the processing control module 132, where one channel of signals are a branch of the input signals and is used as reference signals that are unprocessed, and the other channel of signals are the signals that are output after standard grid comparison. The processing control module 132 controls wavelength drift according to the deviation of the received two channels of signals, and outputs the feedback signals to the feedback controller 110. The feedback controller 110 controls the laser transmitter 120 so that the output wavelength of the laser transmitter 120 remains stable. The feedback controller 110 is capable of controlling wavelength deviation by controlling the laser mandrel temperature and power.

The mode in FIG. 1 provides wavelength stability, but sets the wavelength locking apparatus 130 in the optical module. In this way, each laser needs to use a wavelength locking apparatus 130 separately, thus increasing the cost of each optical module. Because a DWDM system generally contains many optical modules, the overall cost increase using this approach may be considerable.

Figure 2:
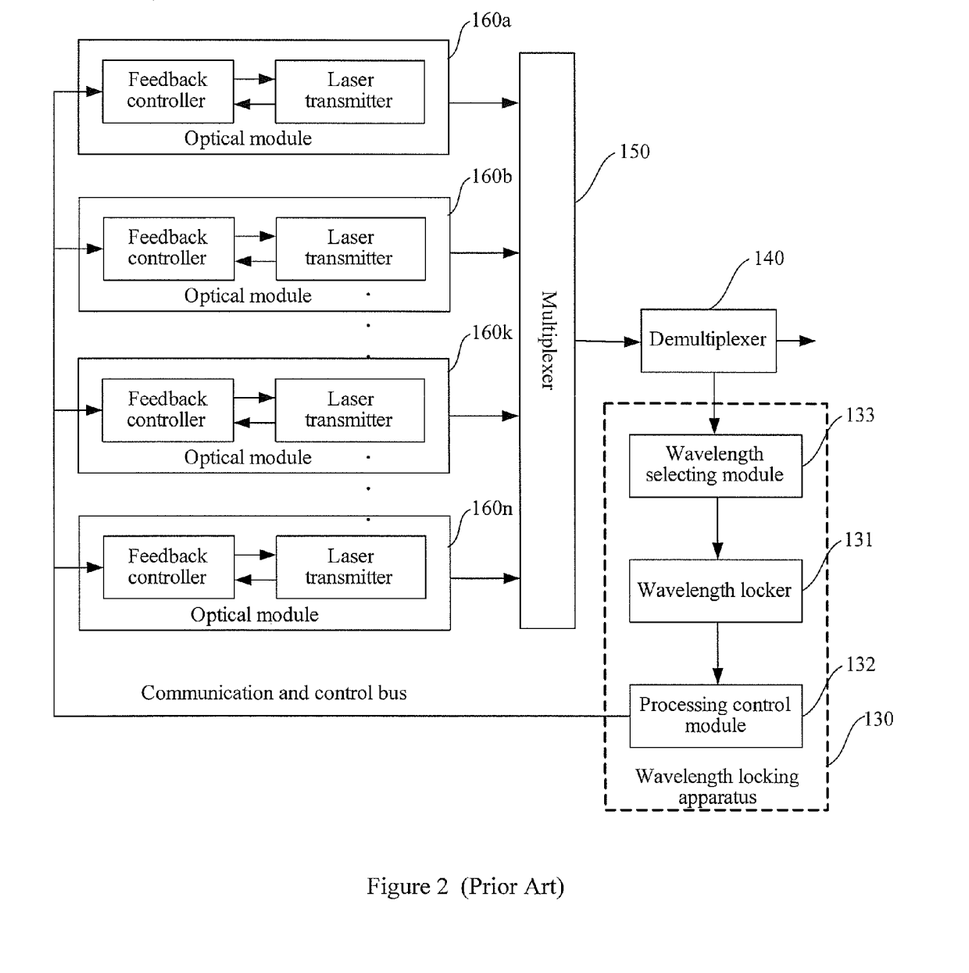
FIG. 2 shows a structure of the second implementation mode in the prior art.

FIG. 2 shows a structure of the second implementation mode in the prior art. In this implementation mode, each optical module contains only a feedback controller and a laser transmitter, for example, optical module 160a to optical module 160n in FIG. 2. The optical signals output from the optical modules are combined by a multiplexer 150 into one optical signal for outputting. The optical signal is demultiplexed by a demultiplexer 140, and a small portion of the demultiplexed optical signal is fed into the wavelength locking apparatus 130. The wavelength locking apparatus 130 includes a wavelength locker 131, a processing control module 132, and a wavelength selecting module 133. The wavelength selecting module 133 receives the optical signal input by the demultiplexer 140, selects the wavelength to be locked among the optical signals of different wavelengths according to the preset policies, and sends the optical signal corresponding to the wavelength to the wavelength locker 131.

Afterward, the wavelength locker 131 outputs two channels of signals to the processing control module 132. The processing control module 132 outputs a feedback signal to the feedback controller in the optical module corresponding to the locked wavelength. Therefore, the laser transmitter in an optical module is controlled and the wavelength output by the optical module remains stable. This processing is exactly the same as the processing in the corresponding part in FIG. 1. In this way, the wavelength selecting module 133 selects the optical signal of each wavelength consecutively so that all wavelengths are selected and locked.

The mode illustrated in FIG. 2 makes multiple optical modules share a wavelength locking apparatus, but the apparatus needs to include a separate wavelength selecting module which is costly. With respect to cost-efficiency, this solution is not optimal. Moreover, the wavelength selecting module is composed of mechanical and electrical units and optical components, and may take a long time to select a wavelength from a beam of optical signals. The mechanical and electrical units can be used for a limited number of times, and have relatively low reliability. In order to meet the life span requirements of telecom equipment, a long locking gap has to be applied, resulting in lower locking precision.

Figure 3:
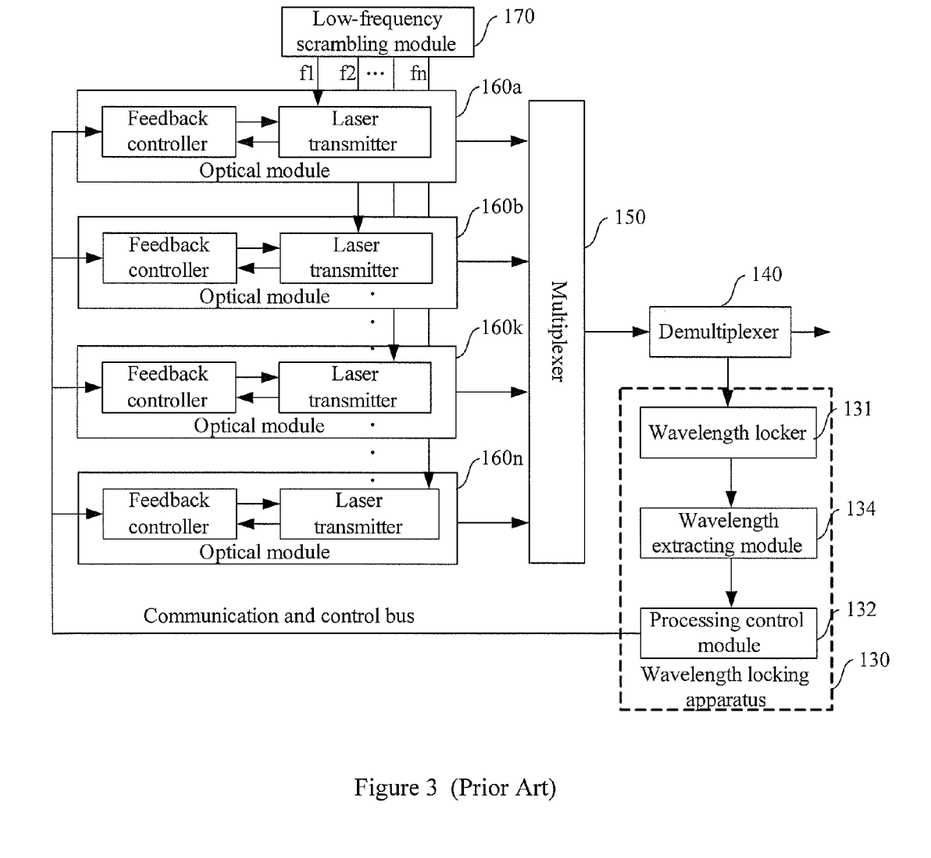
FIG. 3 shows a structure of the third implementation mode in the prior art.

FIG. 3 shows a structure of the third implementation mode in the prior art. The structure of the third implementation mode is almost the same as the structure shown in FIG. 2 except for an additional low-frequency scrambling module 170 which is configured to add a low-frequency modulation signal of different frequencies (f1-fn) to the laser transmitter in each optical module. Generally, the modulation frequency is less than dozens of kilohertz, the Inter-Frequency Gap (IFG) of different wavelengths is typically in the range of 100 KHz-1 KHz, and the modulation amplitude is 1%-5%. Accordingly, the wavelength selecting module is removed from the wavelength locking apparatus 130 and a wavelength extracting module is added instead. The processing of the wavelength locking apparatus 130 may include: the wavelength locker 131 receives the optical signal input by the demultiplexer 140, and outputs two channels of signals to a wavelength extracting module 134. The wavelength extracting module 134 performs digital signal processing, resolves different wavelengths according to different modulation signal frequencies, and transmits the wavelength to be processed to a processing control module 132. The processing control module 132 judges the deviation between the received wavelength and the standard wavelength, and outputs a feedback signal to a feedback controller in the optical module corresponding to the locked wavelength. Therefore, the laser transmitter in the optical module is controlled, and the wavelength output by the optical module remains stable. This processing is exactly the same as the processing in the corresponding part in FIG. 1. In this way, the wavelength extracting module 134 demodulates and resolves all the wavelengths consecutively so that the wavelengths are selected and locked.

For the implementation mode shown in FIG. 3, different low-frequency modulation may need to be performed for different wavelengths simultaneously. Consequently, the low-frequency scrambling apparatus is complicated, and needs to be implemented through the technologies such as decimal frequency division. Moreover, the gap between different perturbation frequencies is small, and interference exists between the frequencies. Therefore, higher requirements are imposed on filtering and extracting of the scrambled signals, the whole apparatus is therefore more complicated, and the reliability of locking wavelengths is reduced.

SUMMARY

An apparatus for detecting wavelength drift and a system and method for locking wavelengths are disclosed in various embodiments to reduce costs and to improve the locking speed and the stability of locking wavelengths.

The technical solution consistent with the present embodiments is described below.

A wavelength drift detecting apparatus may include:

a wavelength locking module, configured to: receive optical signals that are output by a plurality of optical modules and multiplexed, and output the optical signals in two channels, where one channel of signals is unprocessed signals and the other channel of signals includes signals that have undergone comparative processing through a wavelength etalon, and each channel has only one optical signal that carries identifier information; and a signal processing module, configured to: receive two channels of signals from the wavelength locking module, extract the signal that carries the identifier information from each channel of signals, and calculate the wavelength drift value of the optical signal output by the optical module according to the power of the two signals that carry the identifier information.

A system for locking a wavelength includes: an optical module, a multiplexing unit, a wavelength drift detecting apparatus, and a processing control module.

The wavelength drift detecting apparatus is configured to: receive the optical signals that are output by a plurality of optical modules and multiplexed by a multiplexing unit, where each of two channels of signals has only one optical signal that carries identifier information; determine the wavelength drift value of the optical signal that carries the identifier information, and transmit the drift value to a processing control module.

The processing control module is configured to: instruct one of the plurality of optical modules to output the optical signal that carries the identifier information; calculate the feedback signal for controlling the wavelength deviation according to the drift value; and transmit the feedback signal to the optical module corresponding to the optical signal that carries the identifier information.

The optical module is configured to adjust the wavelength of the output optical signal according to the feedback signal after receiving the feedback signal.

A wavelength drift detecting method includes:

receiving optical signals that are output by a plurality of optical modules and multiplexed, and outputting the signals in two channels, where one channel of signals is unprocessed optical signals and the other channel of signals includes optical signals that have undergone comparative processing through a wavelength etalon, and each channel has only one optical signal that carries identifier information; and extracting the signal that carries the identifier information from the two channels of signals, respectively, determining the power of the two signals that carry the identifier information, and calculating the wavelength drift value of the optical signal output by the optical module according to the power.

A method for locking a wavelength in a system includes:

receiving a multiplexed optical signal that is output by a plurality of optical modules, where only one of the plurality of optical modules outputs the optical signal that carries identifier information;

determining a wavelength drift value of the optical signal that carries the identifier information;

calculating a feedback signal for controlling wavelength deviation according to the drift value, and transmitting the feedback signal to the optical module corresponding to the signal that is output by the optical module and carries the identifier information;

adjusting, by the optical module that receives the feedback signal, the wavelength of the output optical signal according to the feedback signal; and instructing the optical module to cancel outputting the identifier information in the optical signal output by the optical module, and instructing another optical module in the plurality of optical modules to output the optical signal that carries the same identifier information, and locking every optical module consecutively. In some embodiments, an optical module outputs an optical signal that carries identifier information, a drift value indicative of the drift between the wavelength of the optical signal that carries the identifier information. The standard wavelength is determined, and a feedback signal for controlling wavelength deviation is output to the optical module that outputs the optical signal carrying the identifier information according to the drift value, with a view to locking the output wavelength of the optical module.

Consistent with disclosed embodiments, multiple optical modules may share a wavelength locking apparatus without any wavelength selecting module. One optical module outputs the optical signal that carries identifier information at a time, and the identifier information carried in the optical signals output by different optical modules is the same. Therefore, the apparatus may be simplified, and the interference between identifier information is eliminated.

DETAILED DESCRIPTION

The present embodiments are hereinafter described in detail by reference to accompanying drawings.

Figure 4:
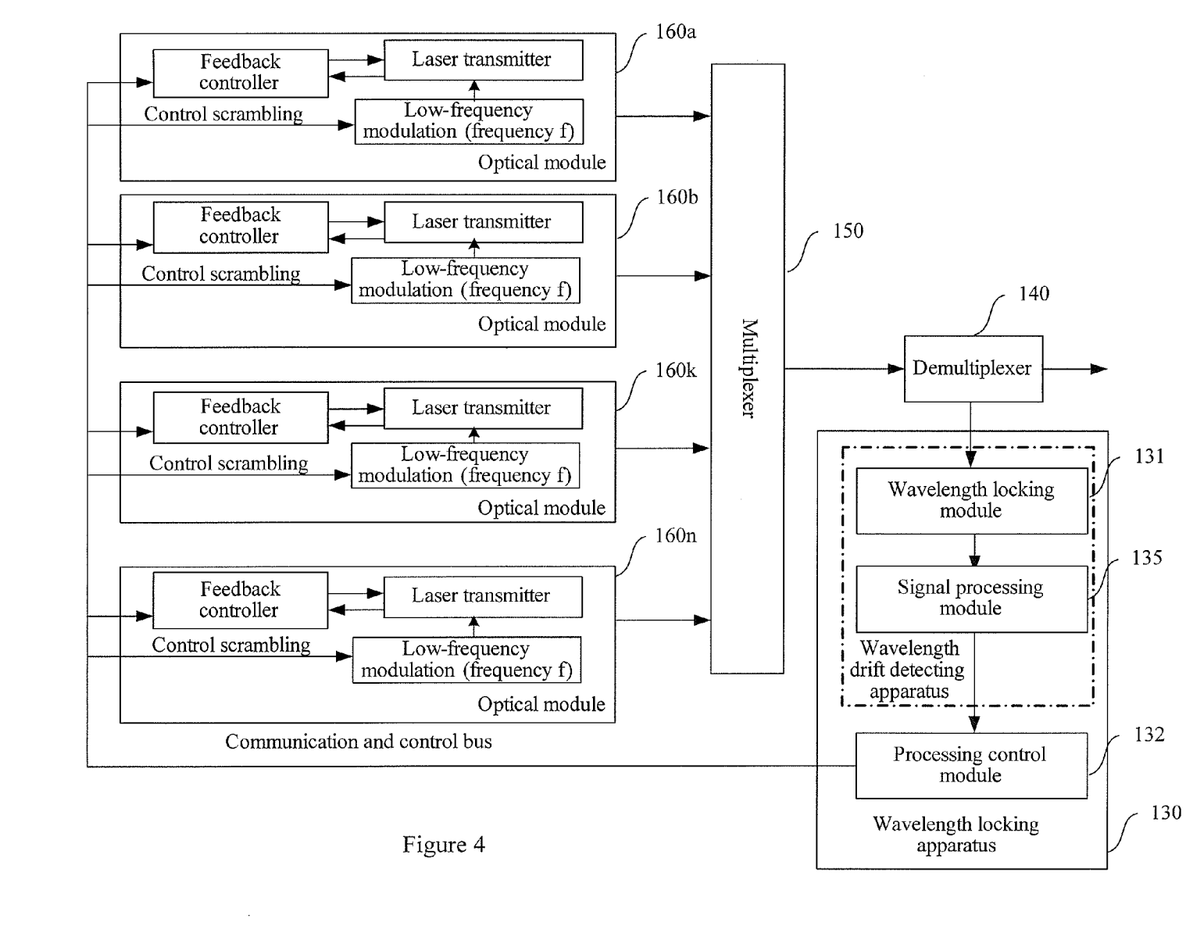
FIG. 4 shows an exemplary structure of an embodiment consistent with the present disclosure.

FIG. 4 shows a structure of an exemplary embodiments. In this embodiment, each optical module may include a feedback controller, a laser transmitter, and a low-frequency modulation module, such as, optical module 160a to optical module 160n in FIG. 4. The optical signals output by the optical modules are combined by a multiplexing unit, such as multiplexer 150 into one optical signal for outputting. The optical signal is demultiplexed by a demultiplexer 140, and a small portion of the demultiplexed optical signal is fed into the wavelength locking apparatus 130. The wavelength locking apparatus 130 includes a wavelength drift detecting apparatus and a processing control module 132. The wavelength drift detecting apparatus includes a wavelength locking module 131 and a signal processing module 135.

The following description takes control of the optical module 160a as an example.

The wavelength drift detecting apparatus is configured to: receive the optical signals that are output by a plurality of optical modules and multiplexed by a multiplexing unit, determine the wavelength drift value of the optical signal that is output by the optical module corresponding to the signal carrying the identifier information (namely, optical module 160a), and transmit the drift value to a processing control module 132.

The processing control module 132 is configured to: instruct one of the plurality of optical modules (namely, optical module 160a) to output the optical signal that carries identifier information; compare the received drift value with the set threshold, calculate the feedback signal for controlling wavelength deviation according to the drift value if determining that the drift value is greater than or equal to the threshold, and transmit the feedback signal to the optical module corresponding to the optical signal that carries the identifier information (namely, optical module 160a), where the signal that carries the identifier information has undergone low-frequency scrambling or code division scrambling.

The optical module that receives the feedback signal (namely, optical module 160a) adjusts the wavelength of the output optical signal according to the feedback signal.

The foregoing wavelength drift detecting apparatus includes a wavelength locking module 131 and a signal processing module 135. In this embodiment, the wavelength locking module 131 is a wavelength locker which is directly available for purchase from the existing market.

The wavelength locker is configured to: receive optical signals that are output by a plurality of optical modules and multiplexed, and output the signals in two channels, where one channel of signals is unprocessed signals, which are also known as reference signals (the same applies hereinafter) and the other channel of signals include signals that have undergone comparative processing through a wavelength etalon, and one of the plurality of optical modules outputs the optical signal that carries identifier information.

The signal processing module 135 is configured to: receive two channels of signals from the wavelength locker, extract the signal that carries the identifier information from each channel of signals, determine the power of the two signals that carry the identifier information, and calculate the wavelength drift value of the optical signal output by the optical module according to the power.

The wavelength locking module 131 may further include an optical-electrical converting unit (not illustrated in the figure). The optical-electrical converting unit is configured to convert the unprocessed signals and the optical signals comparatively processed through a wavelength etalon to electrical signals respectively, and then output the signals.

In the case that the wavelength locking module 131 includes an optical-electrical converting unit, the signal processing module 135 may include an identifier signal extracting unit and a calculating unit (not illustrated in the figure).

The identifier signal extracting unit is configured to: extract the signal that carries identifier information from each channel of electrical signals, and transmit the signal carrying the identifier information to the calculating unit. The identifier information extracting unit may be a low-frequency signal extracting unit or code division signal extracting unit. The low-frequency signal extracting unit may be a low-frequency bandpass filter, and may be a digital filtering apparatus (for example, CPU or Digital Signal Processor (DSP)) or a filtering apparatus composed of electronic components.

The calculating unit is configured to: determine the power of the two signals that carry the identifier information from the identifier signal extracting unit, and calculate the wavelength drift value of the optical signal output by the optical module according to the power.

In the case that the wavelength locking module 131 includes no optical-electrical converting unit, the signal processing module 135 may include an optical-electrical converting unit, an identifier signal extracting unit, and a calculating unit, as described below.

The optical-electrical converting unit is configured to convert the received two channels of optical signals to electrical signals.

The identifier signal extracting unit is configured to: extract the signal that carries identifier information from each channel of electrical signals, and transmit the signal carrying the identifier information to the calculating unit. The identifier information extracting unit may be a low-frequency bandpass filter, and may be a digital filtering apparatus (for example, CPU or DSP) or a filtering apparatus composed of electronic components.

The calculating unit is configured to: determine the power of the two signals that carry the identifier information from the identifier signal extracting unit, and calculate the wavelength drift value of the optical signal output by the optical module according to the power.

That is, the optical-electrical conversion may be performed by the wavelength locking module 131 or signal processing module 135.

Besides, the wavelength drift detecting apparatus may further include a multiplexed signal selecting unit, configured to select multiplexed signals output by one of a plurality of multiplexing units, and input the multiplexed signals into the wavelength locking module in the case that plurality of multiplexing units exist. The multiplexed signal selecting unit may be an N*1 optical switch or a coupler.

The processing control module 132 is further configured to: instruct the optical module that receives the feedback signal (namely, optical module 160a) to cancel the identifier information in the optical signal output by the optical module, and instruct another optical module (for example, optical module 160b) in the plurality of optical modules to output the optical signal that carries the same identifier information. In this way, every optical module is locked consecutively. When every optical module outputs the optical signal that carries the identifier information, the applied identifier information is the same.

In this embodiment, the processing control module 132 uses a communication and control bus to control the low-frequency modulation module in the optical module to instruct the optical module to output the optical signals that have undergone low-frequency scrambling and cancel the optical signals that have undergone low-frequency scrambling. Through a feedback controller in the optical module, the laser transmitter is controlled and the wavelength is locked. The feedback controller is capable of controlling wavelength deviation by controlling the laser mandrel temperature and power.

After a round of wavelength locking operation described above is completed, a new round of wavelength locking operation starts over. It is worthy of attention that the optical signal that carries identifier information in this embodiment is an optical signal which is output by the optical module and undergoes low-frequency scrambling, and the scrambling frequency (for example, frequency f) of all optical modules is the same.

Moreover, a wavelength drift detecting apparatus is also provided herein. As shown in FIG. 4, the wavelength drift detecting apparatus includes a wavelength locking module and a signal processing module.

The wavelength locking module is configured to: receive optical signals that are output by a plurality of optical modules and multiplexed, and output the signals in two channels, where one channel of signals is unprocessed signals and the other channel of signals includes signals that have undergone comparative processing through a wavelength etalon. One of the plurality of optical modules (for example, optical module 160a) carries identifier information, and the signal carrying the identifier information is a signal that has undergone low-frequency scrambling or code division scrambling. The wavelength locking module 131 may be a wavelength locker.

The signal processing module is configured to: receive two channels of signals from the wavelength locking module, extract the signal that carries the identifier information from each channel of signals, determine the power of the two signals that carry the identifier information, and calculate the wavelength drift value of the optical signal output by the optical module according to the power.

The wavelength locking module may further include an optical-electrical converting unit. The optical-electrical converting unit is configured to convert the unprocessed signals and the optical signals comparatively processed through a wavelength etalon to electrical signals respectively, and then output the signals.

In the case that the wavelength locking module includes an optical-electrical converting unit, the signal processing module may include an identifier signal extracting unit and a calculating unit.

The identifier signal extracting unit is configured to: extract the signal that carries identifier information from each channel of electrical signals; and transmit the signal carrying the identifier information to the calculating unit. The identifier information extracting unit may be a low-frequency signal extracting unit or code division signal extracting unit. The low-frequency signal extracting unit may be a low-frequency bandpass filter, and may be a digital filtering apparatus (for example, CPU or Digital Signal Processor (DSP)) or a filtering apparatus composed of electronic components.

The calculating unit is configured to: determine the power of the two signals that carry the identifier information from the identifier signal extracting unit, and calculate the wavelength drift value of the optical signal output by the optical module according to the power.

In the case that the wavelength locking module includes no optical-electrical converting unit, the signal processing module may include an optical-electrical converting unit, an identifier signal extracting unit, and a calculating unit, as described below.

The optical-electrical converting unit is configured to convert the received two channels of optical signals to electrical signals.

The identifier signal extracting unit is configured to: extract the signal that carries identifier information from each channel of electrical signals, and transmit the signal carrying the identifier information to the calculating unit. The identifier information extracting unit may be a low-frequency signal extracting unit or code division signal extracting unit. The low-frequency signal extracting unit may be a low-frequency bandpass filter, and may be a digital filtering apparatus (for example, CPU or Digital Signal Processor (DSP)) or a filtering apparatus composed of electronic components.

The calculating unit is configured to: determine the power of the two signals that carry the identifier information from the identifier signal extracting unit, and calculate the wavelength drift value of the optical signal output by the optical module according to the power.

The wavelength drift detecting apparatus may further include a multiplexed signal selecting unit, configured to: select multiplexed signals output by one of a plurality of multiplexing units, and input the multiplexed signals into the wavelength locking module.

The signal processing module in the wavelength drift detecting apparatus may also include an outputting unit, configured to output a drift value.

Figure 5:
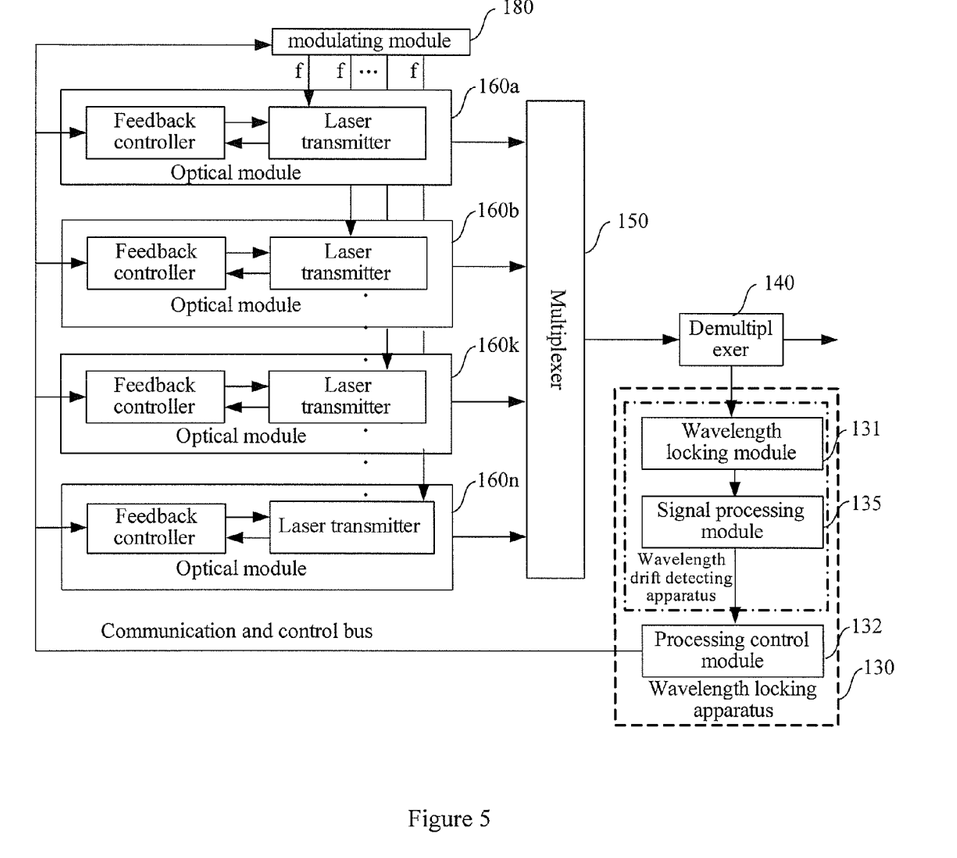
FIG. 5 shows an exemplary structure of another embodiment consistent with the present disclosure.

FIG. 5 shows a structure of another embodiment. This embodiment differs from the embodiment in FIG. 4 in that: All optical modules in the system share a modulating module 180 located outside the optical module in order to scramble the signals output by a specific optical module. Other aspects are the same as the embodiment in FIG. 4, and are not detailed here any further.

Another method for locking a wavelength in a system includes:

(a) Outputting, by one of multiple optical modules, an optical signal that carries identifier information, where the signal carrying the identifier information may be a signal that has undergone low-frequency scrambling or code division scrambling.

The identifier information is intended for identifying a signal of a specific wavelength in the subsequent processing, and checking for the deviation between the wavelength of this signal and the standard wavelength. In this embodiment, the optical module generally has an interface for adding low-frequency modulation. A logical component may generate a low-frequency signal of a specific frequency, and the low-frequency signal is added from this interface into the optical module. In this way, low-frequency perturbation is added into the output optical signal, and the optical signal can be identified. The frequency of low-frequency perturbation ranges from 1 KHz to 1000 KHz, and the modulation depth ranges from 1% to 5%. It is understandable that the low-frequency perturbation added into the optical module is a method for adding identifier information into the optical signal. Accordingly, in the subsequent steps, the optical signal may be extracted according to this specific identification method. In other embodiments, other identification methods may be applied only if the optical signal is identified properly.

(b) Receiving the optical signals that are output by multiple optical modules and multiplexed, and determining the wavelength drift value of the optical signal output by the optical module corresponding to the signal that carries identifier information.

Because the received signal is multiplexed from more than one channel of optical signals and cannot be used directly as a basis for locking wavelengths, an optical signal of a specific wavelength needs to be extracted to determine the deviation between the wavelength of this optical signal and the standard wavelength. In this embodiment, identifier information is added into the optical signal in step (a). Therefore, the signal of this wavelength can be extracted according to the identifier information. For example, if 10 KHz low-frequency perturbation is already added into an optical signal, the 10 KHz signal can be extracted out here through filtering.

The foregoing process of determining the wavelength drift value of the optical signal output by the optical module corresponding to the signal that carries the identifier information includes the following two steps.

(i) After the optical signals that are output by multiple optical modules and multiplexed are processed by a wavelength locker, two channels of signals are output. One channel of signals are unprocessed optical signals, and the other channel of signals are optical signals that have undergone comparative processing through a wavelength etalon.

This step (i) is performed by a wavelength locker. Specifically, after receiving a multiplexed input signal, the wavelength locker uses a demultiplexing unit to split the signal into two channels. One channel is output directly without any processing, and the signals that are output directly without processing serve as reference signals subsequently. The other channel of signals is output after being comparatively processed by a wavelength etalon in the wavelength locker. In this embodiment, the wavelength etalon in the wavelength locker is a Fabry-Perot etalon. The comparative processing may be interference processing for the signals, for example, the signals undergoes interference processing through an etalon interferometer. The incident light of different wavelengths interferes with each other, thus generating different attenuation. Subsequently, the reference signal may be compared with the signal processed by the interferometer to know the deviation between the wavelength of the input signal and the standard wavelength. In practice, the foregoing wavelength locker may be a wavelength locker with a dielectric film filter disc. The present embodiments do not limit the type of the applied wavelength locker.

(ii) The two channels of optical signals are converted to electrical signals respectively. The signal that carries the identifier information is extracted from each channel of electrical signals, the power of the two signals that carry the identifier information is determined, and the wavelength drift value of the optical signal output by the optical module is determined according to the power.

An exemplary method of calculating the wavelength drift value according to the power is elaborated below.

The power value of the reference signal that carries the identifier information is divided by the power value of the signal comparatively processed by a wavelength etalon to obtain a power ratio.

The table of the preset power ratio versus the wavelength drift value is searched to determine the drift value corresponding to the power ratio.

The process of calculating the power ratio and the process of setting the table of the power ratio versus the wavelength drift value are commonly understood in the art and are therefore not described in detail.

(c) Determining the feedback signal for controlling wavelength deviation according to the drift value; and transmitting the feedback signal to the optical module corresponding to the optical signal that carries the identifier information.

The process of calculating the feedback signal is commonly understood in the art. and is not detailed here any further. Before calculating the feedback signal, the process further includes: comparing the drift value with the preset threshold; and calculating the feedback signal for controlling wavelength deviation only if determining that the drift value is greater than or equal to the threshold.

(d) Adjusting, by the optical module that receives the feedback signal, the wavelength of the output optical signal according to the feedback signal; and performing, by the feedback controller in the optical module, fine tuning of the wavelength by controlling the mandrel temperature and power according to the obtained feedback signal in order to keep stability of the wavelength.

The process of fine-tuning the wavelength is commonly understood in the art, and is not detailed here any further.

Now, the wavelength output by one of multiple optical modules is locked. Afterward, the method may further include:

(e) Instructing the optical module to cancel outputting the identifier information in the optical signal output by the optical module, and instructing another optical module in the plurality of optical modules to output the optical signal that carries the same identifier information, and locking every optical module consecutively. In this way, multiple optical modules in the system can be locked. Afterward, a new round of wavelength locking operation may start over.

Besides, in the case that more than one multiplexing unit exists, for example, multiplexing unit 1 multiplexes the optical signals output by the optical modules 1-5, multiplexing unit 2 multiplexes the optical signals output by the optical modules 6-15, and multiplexing unit 3 multiplexes the optical signals output by the optical modules 16-21, the foregoing method may further include: selecting multiplexed signals output by one of a plurality of multiplexing units, and inputting the multiplexed signals into a wavelength locking apparatus to perform wavelength locking. That is, if one multiplexing unit and the subsequent optical modules are regarded as one group, a group can be selected for locking the wavelength.

In this embodiment, the optical signal that carries identifier information is an optical signal which is output by the optical module and undergoes low-frequency scrambling, and the scrambling frequency (for example, frequency f) of all optical modules is the same. In the case that the signal that carries the identifier information is a signal that has undergone low-frequency scrambling, the process of extracting the signal that carries the identifier information is performed through low-frequency bandpass filtering.

In this embodiment, the low-frequency scrambling is performed by a modulating module. The modulating module may be located in each optical module, or all optical modules in the system share a modulating module located outside the optical modules.

A wavelength drift detecting method provided herein includes:
  receiving optical signals that are output by multiple optical modules and multiplexed, and outputting the signals in two channels, where one channel of signals are unprocessed optical signals, and the other channel of signals are optical signals that have undergone comparative processing through a wavelength etalon; and converting the two channels of optical signals to electrical signals respectively, extracting the signal that carries identifier information from each channel of electrical signals, determining the power of the two signals that carry the identifier information, and calculating the wavelength drift value of the optical signal output by the optical module according to the power.

The foregoing method may further include: selecting multiplexed signals output by one of a plurality of multiplexing units to perform wavelength locking.

The method may further include: outputting the wavelength drift value.

The signal carrying the identifier information is a signal that has undergone low-frequency scrambling or code division scrambling. In the case that the signal that carries the identifier information is a signal that has undergone low-frequency scrambling, the process of extracting the signal that carries the identifier information is performed through low-frequency bandpass filtering.

Therefore, in the embodiments consistent with the present disclosure, multiple optical modules may share one apparatus for locking the wavelength, without requiring any wavelength selecting module for selecting the wavelength of the optical signals. Moreover, the optical signals that carry identifier information may be implemented through scrambling. The output signals of only one optical module are scrambled at a time. When different optical modules output the optical signals that carry the identifier information, the identifier information is the same (for example, the same frequency is applied to scrambling of each optical signal). Therefore, applying the disclosed embodiments may simplify the scrambling apparatus, eliminate the interference between the scrambling signals, reduce the cost, increase the locking speed, improve the accuracy of signal processing, and enhance the precision of wavelength locking.

Although the disclosed embodiments have been described through several exemplary embodiments, the invention is not limited to such embodiments. It is apparent that those skilled in the art can make various modifications and variations to the invention without departing from the spirit and scope of the invention. The invention is intended to cover the modifications and variations provided that they fall in the scope of protection defined by the claims or their equivalents.

What is claimed is:

1. A wavelength drift detecting apparatus, comprising:
a wavelength locking module, configured to:
receive optical signals that are output by a plurality of optical modules and multiplexed, and output the optical signals in two channels, wherein one channel of signals comprises unprocessed signals, the other channel of signals has undergone comparative processing through a wavelength etalon, and each channel has only one optical signal that carries identifier information, wherein the only one optical signal carrying identifier information from each channel is a signal that has undergone code division scrambling; and a signal processing module, configured to:
receive the two channels from the wavelength locking module, extract a signal that carries the identifier information from each channel, and calculate a wavelength drift value of the optical signals output by the plurality of optical modules based on a power of two signals that carry the identifier information, and wherein the signal processing module comprises: a code division signal extracting unit, configured to: extract the signal that carries the identifier information from each channel, and transmit the signal carrying the identifier information to the calculating unit; and a calculating unit, configured to: determine the power of the two signals that carry the identifier information from the identifier signal extracting unit, and calculate the wavelength drift value of the optical signals output by the plurality of optical modules based on the power of the two signals.

2. The wavelength drift detecting apparatus of claim 1, wherein:
the wavelength locking module comprises an optical-electrical converting unit, configured to: convert unprocessed signals and optical signals comparatively processed through the wavelength etalon to electrical signals respectively, and output the signals.

3. The wavelength drift detecting apparatus of claim 1, wherein the signal processing module further comprises:
an optical-electrical converting unit, configured to convert the received two channels to electrical signals.

4. A system for locking a wavelength, comprising an optical module and a multiplexing unit, and further comprising:
a wavelength drift detecting apparatus, configured to:
receive optical signals that are output by a plurality of optical modules and multiplexed by the multiplexing unit, and split the optical signals into two channels, wherein one channel of signals comprises unprocessed signals, the other channel of signals has undergone comparative processing through a wavelength etalon, and each of two channels of signals has only one optical signal that carries identifier information, wherein the only one optical signal carrying identifier information from each channel is a signal that has undergone code division scrambling; and
extract a signal carrying the identifier information from each channel through a code division signal extracting unit, determine a wavelength drift value of the optical signal that carries the identifier information according to the extracted signal from each channel, and transmit the wavelength drift value to a processing control module, wherein the processing control module is configured to: instruct one of the plurality of optical modules to output the optical signal that carries the identifier information, calculate a feedback signal for controlling wavelength deviation according to the wavelength drift value, and transmit the feedback signal to the optical module corresponding to the optical signal that carries the identifier information, wherein the optical module is configured to adjust wavelength of the output optical signal according to the feedback signal after receiving the feedback signal.

5. The system of claim 4, wherein the wavelength drift detecting apparatus comprises:
a wavelength locking module, configured to:
receive the optical signals that are output by the plurality of optical modules and multiplexed, and output the optical signals in two channels, wherein one channel of signals comprises unprocessed signals, the other channel of signals comprises signals that have undergone comparative processing through a wavelength etalon, and each channel has only one optical signal that carries the identifier information, wherein the only one optical signal carrying identifier information is a signal that has undergone code division scrambling; and
a signal processing module, configured to:
receive the two channels of signals from the wavelength locking module, extract the signal that carries the identifier information from each channel of the signals through a code division signal extracting unit, determine power of the two signals that carry the identifier information, and calculate the wavelength drift value of the optical signals output by the plurality of optical modules according to the power of the two signals.

6. The system of claim 4, wherein:

the processing control module is further configured to:

instruct the optical module that receives the feedback signal to cancel outputting the identifier information in the optical signal output by the optical module, and instruct another optical module in the plurality of optical modules to output the optical signal that carries the same identifier information.

7. A wavelength drift detecting method, comprising:

receiving optical signals that are output by a plurality of optical modules and multiplexed;

outputting the optical signals in two channels, wherein one channel of signals comprises unprocessed optical signals, the other channel of signals has undergone comparative processing through a wavelength etalon, and each channel has only one optical signal that carries identifier information, wherein the only one optical signal carrying identifier information from each channel is a signal that has undergone code division scrambling;

extracting a signal that carries the identifier information from the two channels of the optical signals respectively through a code division signal extracting unit;

determining a power of two signals that carry the identifier information; and calculating a wavelength drift value of the optical signals output by the plurality of optical modules according to the power of the two signals.

8. A method for locking a wavelength in a system, comprising:

receiving a multiplexed optical signal that is output by a plurality of optical modules, wherein only one of the plurality of optical modules outputs an optical signal that carries identifier information, and wherein the optical signal carrying identifier information is a signal that has undergone code division scrambling;

splitting the multiplexed optical signals into two channels, wherein one channel of signals comprises unprocessed optical signals, and the other channel of signals has undergone comparative processing through a wavelength etalon; and converting each of the two channels of optical signals to electrical signals, respectively, and extracting a signal that carries the identifier information from each corresponding channel of electrical signals through a code division signal extracting unit;

determining power of two signals that carry the identifier information;

calculating a wavelength drift value of the optical signals output by the plurality of optical modules based on the power;

calculating a feedback signal for controlling wavelength deviation according to the wavelength drift value, and transmitting the feedback signal to an optical module corresponding to the optical signal that carries the identifier information;

adjusting, by the optical module that receives the feedback signal, the wavelength of the output optical signal according to the feedback signal;

instructing the optical module to cancel outputting the identifier information in the optical signal output by the optical module;

instructing another optical module in the plurality of optical modules to output the optical signal that carries the same identifier information; and locking each of the plurality of optical module consecutively.

9. The method of claim 8, wherein before calculating the feedback signal for controlling the wavelength deviation, the method further comprises:

comparing the wavelength drift value with a preset threshold; and calculating the feedback signal for controlling the wavelength deviation if determining that the wavelength drift value is greater than or equal to the preset threshold.

* * * * *